United States Patent
Kim et al.

(10) Patent No.: US 10,649,098 B2
(45) Date of Patent: May 12, 2020

(54) LIGHT CONVERTING NANOPARTICLE, METHOD OF MAKING THE LIGHT CONVERTING NANOPARTICLE, AND COMPOSITION AND OPTICAL FILM COMPRISING THE SAME

(71) Applicants: SAMSUNG ELECTRONICS CO., LTD., Suwon-si (KR); THE REGENTS OF THE UNIVERSITY OF CALIFORNIA, Oakland, CA (US)

(72) Inventors: Kwanghee Kim, Seoul (KR); Yehonadav Bekenstein, Berkeley, CA (US); Yong Chul Kim, Seoul (KR); Paul Alivisatos, Berkeley, CA (US); In Taek Han, Seoul (KR)

(73) Assignees: SAMSUNG ELECTRONICS CO., LTD., Gyeonggi-Do (KR); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 6 days.

(21) Appl. No.: 15/882,055

(22) Filed: Jan. 29, 2018

(65) Prior Publication Data
US 2019/0235094 A1    Aug. 1, 2019

(51) Int. Cl.
*B32B 5/16* (2006.01)
*G01T 1/202* (2006.01)
(Continued)

(52) U.S. Cl.
CPC .......... *G01T 1/2023* (2013.01); *C09K 11/665* (2013.01); *C09K 11/7435* (2013.01); *H01L 27/14663* (2013.01)

(58) Field of Classification Search
CPC .................. C09K 11/665; C09K 11/7435
See application file for complete search history.

(56) References Cited

U.S. PATENT DOCUMENTS 6,784,432 B2    8/2004   Wieczorek
9,061,901 B2    6/2015   Cao et al.
(Continued)

FOREIGN PATENT DOCUMENTS

JP    2002214349 A    7/2002
JP    3551851 B2      8/2004
(Continued)

OTHER PUBLICATIONS

Sun Li, S; Wang, YS; Zhao, SL; Xu, Z; Xue, WW. Photostimulated luminescence properties of KCl:Cu+ after UV excitation, Spectroscopy and Spectral Analysis 25 (10): 1733-1735 (2005). (Year: 2005).*

(Continued)

*Primary Examiner* — Hoa (Holly) Le
(74) *Attorney, Agent, or Firm* — Cantor Colburn LLP

(57) ABSTRACT

A light converting nanoparticle represented by Chemical Formula 1, $$AX_x \qquad \text{Chemical Formula 1}$$

wherein, in Chemical Formula 1,
A comprises an alkaline metal element, an alkaline-earth metal element, or a combination thereof,
X comprises a halogen element, and
x is 1 or 2 and is selected such that Chemical Formula 1 is electrically neutral, and
a dopant substituted for a portion of A, wherein the dopant comprises $Tl^+$, $In^+$, $Pb^{2+}$, $Bi^{3+}$, $Ag^+$, $Cu^+$, $Eu^{2+}$, $Mn^{2+}$, or a combination thereof,
wherein a content of the dopant is less than 15 mole percent, based on a total moles of A,
wherein the light converting nanoparticle has a particle diameter of less than or equal to about 100 nanometers, and the light converting nanoparticle has a structure,
(Continued)

cubic structure, an orthorhombic structure, a rhombic dodecahedron structure, or a combination thereof.

18 Claims, 14 Drawing Sheets

(51) Int. Cl.
*C09K 11/74* (2006.01)
*C09K 11/66* (2006.01)
*H01L 27/146* (2006.01)

(56) References Cited

U.S. PATENT DOCUMENTS

| | | | |
|---|---|---|---|
| 9,120,907 B2 | 9/2015 | Kalliopuska et al. | |
| 9,618,632 B2 | 4/2017 | Stanton et al. | |
| 2010/0236625 A1* | 9/2010 | Kenney | H01L 31/055 136/259 |
| 2010/0270517 A1 | 10/2010 | Hong et al. | |
| 2014/0203211 A1* | 7/2014 | Totsuka | C09K 11/7435 252/301.4 H |
| 2015/0092912 A1 | 4/2015 | Jiang et al. | |
| 2016/0280992 A1 | 9/2016 | Kawai et al. | |
| 2017/0186922 A1* | 6/2017 | Kim | C09K 11/703 |

FOREIGN PATENT DOCUMENTS

| | | |
|---|---|---|
| JP | 2006184166 A | 7/2006 |
| JP | 2006266936 A | 10/2006 |
| JP | 2008107279 A | 5/2008 |
| JP | 4725533 B2 | 7/2011 |
| JP | 5603461 B1 | 10/2014 |
| KR | 101946598 B1 | 3/2010 |
| KR | 101003693 B1 | 12/2010 |
| KR | 101034471 B1 | 5/2011 |
| KR | 101621387 B1 | 5/2016 |
| KR | 101659860 B1 | 9/2016 |

OTHER PUBLICATIONS

Lim et al., Binary halide, ternary perovskite-like, and perovskite-derivative nanostructures: hot injection synthesis and optical and photocatalytic properties, Nanoscale, 2017, 9, 3747 (Year: 2017).*
Santiuste et al., Fluorescence_decay_time of Eu 2+ doped alkali halides. Effect_of_europium_precipitation, Cryst. Latt. Def and Amorph. Mat., 1987, vol. 16, pp. 249-255 (Year: 1987).*
Van Gin Hoven & Schultz, Off-center Tl and Na dopant centers in CsI, J. Phys.: Condens. Matter 25 (2013) 495504 (6pp) [http://dx.doi.org/10.1088/0953-8984/25/49/495504] (Year: 2013).*
Wu et al., Scintillation Characteristics of Indium Doped Cesium Iodide Single Crystal, IEEE Transactions on Nuclear Science, vol. 62, No. 2, Apr. 2015 (Year: 2015).*

* cited by examiner

LIGHT CONVERTING NANOPARTICLE, METHOD OF MAKING THE LIGHT CONVERTING NANOPARTICLE, AND COMPOSITION AND OPTICAL FILM COMPRISING THE SAME

BACKGROUND

1. Field

A Light converting nanoparticle, a method of making the light converting nanoparticle, and compositions and optical films comprising the light converting nanoparticle are disclosed.

2. Description of the Related Art

A device for imaging an inside of a subject by irradiating an X-ray into a subject and detecting an intensity distribution of the X-ray penetrating the subject has been widely used in medical diagnosis, nondestructive inspection, and the like.

An X-ray detector is a device for converting an intensity distribution of the X-ray penetrating the subject into an electrical and/or optical signal, and obtaining an image seen through the subject.

A method of converting a portion of X-ray energy penetrating the subject into an electrical signal is to convert a portion of the X-ray energy into an amount of charge, and is referred to as direct conversion. The direct conversion method shows excellent imaging efficiency but has high costs for a measurement and detection.

Alternatively, a method of converting a portion of X-ray energy penetrating the subject into optical energy having a particular wavelength region (ultraviolet ("UV"), visible light, and the like) is referred to as an indirect conversion method and is applicable to a large-area of a subject and thus is widely being used for an X-ray measuring equipment.

The indirect conversion method uses an X-ray detector in which an X-ray scintillator comprises a monocrystal to provide a photoelectric conversion detector, such as a thin film transistor ("TFT") equipped with a complementary metal-oxide semiconductor ("CMOS"), a charge coupled device ("CCD"), a photodiode ("PD"), or the like. The monocrystal can be provided using a vacuum deposition method, a Czochralski ("Cz") method, or the like.

However, to provide such an X-ray scintillator takes a long period of time to grow the monocrystal, and thus has a high process cost, and includes difficult and complex process conditions. In addition, when the monocrystal has too small a size, photoconversion efficiency may be deteriorated because of light scattering, and thus the size of the monocrystal is desirably grown to have a size of several micrometers to hundreds of micrometers. Furthermore, since transparency of the X-ray scintillator is deteriorated as a particle size is increased, self-photoconversion efficiency may be deteriorated.

Accordingly, an X-ray scintillator having improved transparency and a low manufacturing cost in a simplified process would be desirable.

SUMMARY

An embodiment provides a novel light converting nanoparticle having improved transparency and photoconversion characteristics, and a method of making the light converting nanoparticle with a low cost in a simplified process.

Another embodiment provides a composition and an optical film including the light converting nanoparticle.

According to an embodiment, a light converting nanoparticle is represented by Chemical Formula 1,

wherein, in Chemical Formula 1,

A comprises an alkaline metal element, an alkaline-earth metal element, or a combination thereof, X comprises a halogen element, and x is 1 or 2 and is selected such that Chemical Formula 1 is electrically neutral, and a dopant substituted for a portion of A, wherein the dopant comprises $Tl^+$, $In^+$, $Pb^{2+}$, $Bi^{3+}$, $Ag^+$, $Cu^+$, $Eu^{2+}$, $Mn^{2+}$, or a combination thereof, wherein a content of the dopant is less than 15 mole percent, based on a total moles of A, wherein the light converting nanoparticle has a particle diameter of less than or equal to about 100 nanometers (nm), and wherein the light converting nanoparticle includes a cubic structure, an orthorhombic structure, a rhombic dodecahedron structure, or a combination thereof.

A bandgap energy (Eg) of the light converting nanoparticle may be greater than or equal to about 3.5 electronvolts (eV).

Each of A and X may independently include a Period 3 element to a Period 5 element of the periodic table of elements, and a maximum difference between a value of the period element of A and the period element of X may be less than or equal to 1.

A may include Rb, Cs, Sr, Ba, or a combination thereof, and X may be include Br, I, or a combination thereof.

The light converting nanoparticle may have an average particle diameter of about 20 nm to about 50 nm.

At least a portion of A is be substituted with a dopant.

The dopant may include $Tl^+$, $In^+$, $Pb^{2+}$, $Bi^{3+}$, $Ag^+$, $Cu^+$, $Eu^{2+}$, $Mn^{2+}$, or a combination thereof.

An amount of the dopant may be about 0.05 mole percent (mol %) to about 1.0 mol %, based on a total moles of A.

At least at least one ligand may be attached to a surface of the light converting nanoparticle.

The ligand may be a cationic organic surfactant, an anionic organic surfactant, or a combination thereof.

The ligand may be oleic acid, octanoic acid, phosphonic acid, oleyl amine, octyl amine, or a combination thereof.

An absorption wavelength of the light converting nanoparticle may be less than or equal to about 300 nm and an emission wavelength of the light converting nanoparticle may be about 380 nm to about 780 nm.

A central emission wavelength of the light converting nanoparticle may be about 500 nm to about 600 nm.

According to another embodiment, a composition for a light converting layer including the light converting nanoparticle is provided.

According to another embodiment, an optical film including the light converting nanoparticle is provided.

Another according to an embodiment, a method of making a light converting nanoparticle includes: adding a first precursor solution including a halogen element into a reaction vessel; adding a dopant comprising $Tl^+$, $In^+$, $Pb^{2+}$, $Bi^{3+}$, $Ag^+$, $Cu^+$, $Eu^{2+}$, $Mn^{2+}$, or a combination thereof to the reaction vessel; heating the reaction vessel to a selected temperature, contacting the first precursor solution with a second precursor solution, the second precursor solution including an alkaline metal element, an alkaline-earth metal element, or a combination thereof to form the light converting nanoparticle, wherein the light converting nanoparticle has a particle diameter of less than or equal to about 100 nm, and the light converting nanoparticle includes an orthorhombic structure, a cubic structure, a rhombic dodecahedron structure, or a combination thereof.

The method of making the light converting nanoparticle may further include adding a doping material including $Tl^+$, $In^+$, $Pb^{2+}$, $Bi^{3+}$, $Ag^+$, $Cu^+$, $Eu^{2+}$, $Mn^{2+}$, or a combination thereof to the reaction vessel before heating the reaction vessel.

The method of making the light converting nanoparticle may further include reacting the light converting nanoparticle with a ligand precursor to attach the ligand to a surface of the light converting nanoparticle.

A heating temperature of the reaction vessel may be about 100° C. to about 400° C.

After injecting the first precursor, a temperature of the reaction vessel may be maintained for about 1 second to about 10 minutes.

An absorption wavelength of the light converting nanoparticle may be less than or equal to about 300 nm and an emission wavelength of the light converting nanoparticle may be about 380 nm to about 780 nm.

A light converting nanoparticle having improved transparency and improved light converting characteristics, and a composition and an optical film including the same are provided.

In addition, a method of making the light converting nanoparticle with a low cost in a simplified process may be provided.

BRIEF DESCRIPTION OF THE DRAWINGS

The above and other aspects, advantages and features of this disclosure will become more apparent by describing in further detail exemplary embodiments thereof with reference to the accompanying drawings, in which:

FIGS. 4 and 5 are TEM images of an embodiment of the light converting nanoparticle, wherein FIG. 4 shows a case in which the light converting nanoparticle is not doped, and FIG. 5 shows another case in which the light converting nanoparticle is doped;

DETAILED DESCRIPTION

Figure 1:
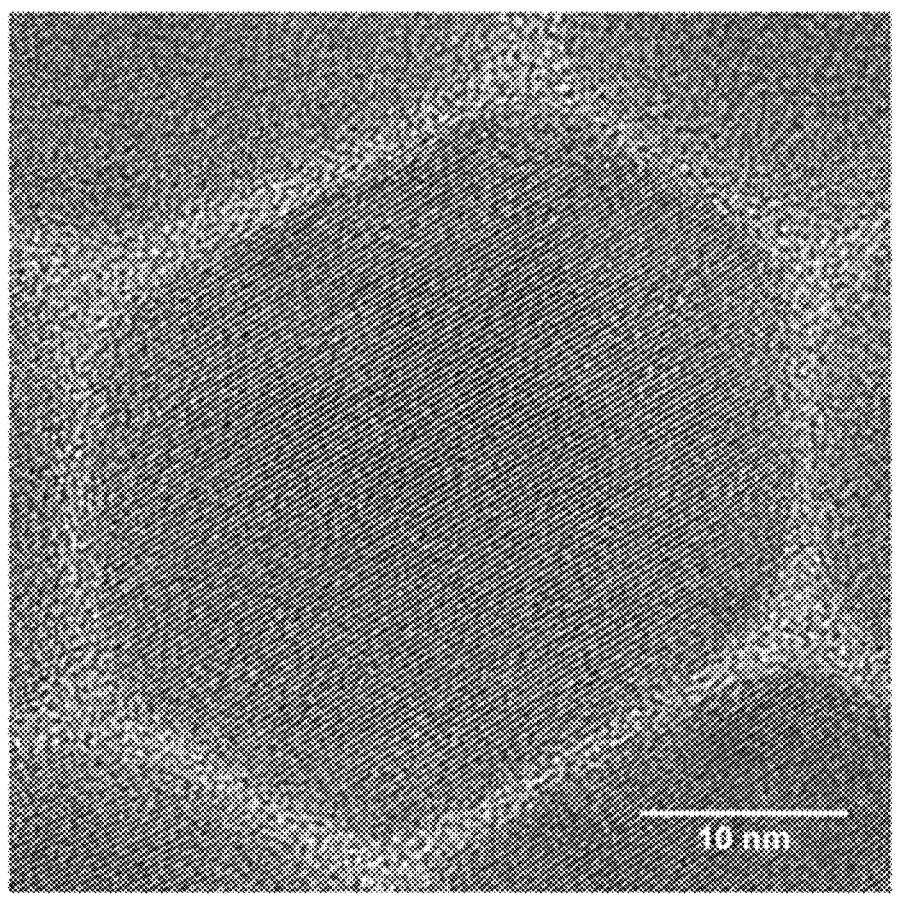
FIG. 1 is a transmission electron microscope (TEM) image showing an embodiment of the light converting nanoparticle.

Hereinafter, embodiments will be described in further detail with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a light converting nanoparticle according to an embodiment is described with reference to FIGS. 1 to 7.

A light converting nanoparticle according to an embodiment comprises a material represented by Chemical Formula 1.

$$AX_x \qquad \text{Chemical Formula 1}$$

In Chemical Formula 1, A comprises an alkaline metal element, an alkaline-earth metal element, or a combination thereof, X comprises a halogen element, and x is 1 or 2 and is selected such that Chemical Formula 1 is electrically neutral.

In other words, the light converting nanoparticle according to an embodiment has a cation moiety corresponding to A of Chemical Formula 1 and comprising an alkaline metal, an alkaline-earth metal, or a combination thereof and an anion moiety corresponding to X and comprising a halogen element, and thus, since A and X are ionically bonded in a selected mole ratio, Chemical Formula 1 may be chemically neutral.

The light converting nanoparticle according to an embodiment may have relatively high bandgap energy (Eg). For example, the bandgap energy of the light converting nanoparticle according to an embodiment may be greater than or equal to about 3.4 electronvolts (eV), for example greater than or equal to about 3.5 eV, greater than or equal to about 3.6 eV, greater than or equal to about 3.8 eV, greater than or equal to about 4.0 eV, greater than or equal to about 4.2 eV, greater than or equal to about 4.4 eV, greater than or equal to about 4.6 eV, greater than or equal to about 4.8 eV, greater than or equal to about 5.0 eV, greater than or equal to about 5.2 eV, greater than or equal to about 5.4 eV, greater than or equal to about 5.6 eV, greater than or equal to about 5.8 eV, greater than or equal to about 6.0 eV, or greater than about 6.0 eV, e.g., about 3.4 eV to about 10 eV, or 4 eV to 9 eV.

When the light converting nanoparticle has a relatively high bandgap energy as aforementioned, the light converting nanoparticle may have high absorption capability for light belonging to a relatively high wavelength region, for example, near ultraviolet ("UV"), ultraviolet ("UV"), X-ray, γ-ray, and the like, and may show optically transparent characteristics in a visible light region.

The light converting nanoparticle according to an embodiment may absorb light in a high energy of less than or equal to a near ultraviolet ("UV") to an ultraviolet ("UV") wavelength region. For example, an absorption wavelength region of the light converting nanoparticle may be, for example, less than or equal to about 380 nm (a near ultraviolet ("UV") region), for example, less than or equal to about 360 nm, less than or equal to about 340 nm, less than or equal to about 320 nm (an ultraviolet ("UV") region), less than or equal to about 300 nm, less than or equal to about 280 nm, less than or equal to about 100 nm, less than or equal to about 50 nm, less than or equal to about 10 nm, less than or equal to about 1 nm (an X-ray region), less than or equal to about $10^{-1}$ nm, less than or equal to about $10^{-2}$ nm, or less than or equal to about $10^{-3}$ nm (a γ-ray region) at room temperature and at a low temperature ranging from about 4 Kelvin (K) to about 100 K.

On the contrary, the light converting nanoparticle according to an embodiment may emit light at a wavelength belonging to a visible light region at room temperature and a low temperature ranging from 4 K to 100 K. For example, the light converting nanoparticle according to an embodiment may have an emission wavelength ranging from, for example, greater than about 380 nm, greater than or equal to about 420 nm, greater than or equal to about 460 nm, greater than or equal to about 500 nm, greater than or equal to about 540 nm, greater than or equal to about 580 nm, greater than or equal to about 620 nm, or greater than or equal to about 660 nm and, and less than or equal to about 780 nm.

A central emission wavelength of the light converting nanoparticle according to an embodiment may be variously selected depending on the above range, for example, and may be in a range of greater than or equal to about 460 nm, greater than or equal to about 480 nm, greater than or equal to about 500 nm, greater than or equal to about 520 nm, or greater than or equal to about 540 nm and for example, less than or equal to about 660 nm, less than or equal to about 640 nm, less than or equal to about 620 nm, or less than or equal to about 600 nm. When the central emission wavelength of the light converting nanoparticle satisfies the above-described ranges, an absorption wavelength signal may be easily detected using an optical detector having excellent light measurement efficiency and having a relatively low cost.

The central emission wavelength of the light converting nanoparticle according to an embodiment and a type of the optical detector are not limited within the above ranges, rather, the light converting nanoparticle may have a central emission wavelength of various ranges within a visible light region.

In this way, the light converting nanoparticle according to an embodiment may have high bandgap energy by including elements respectively belonging to Periods 3 and 5 for the A and X in Chemical Formula 1, for example.

In addition, according to an embodiment, a maximum value of a difference between a value of the period of A and a value of the period of X may be less than or equal to 1, e.g., at least one of the A and X may be a Period 3 element and the other may be a Period 4 element. In this way, when the light converting nanoparticle is formed of a compound that the elements having a period difference of less than or equal to about 1 or in the same period are bonded, the elements A and the X provide no large ionic radius difference, and thus an ionic crystal may be well formed and avoid producing a lattice defect in a crystal structure thereof.

Also, according to an embodiment, A may be Rb, Cs, Sr, Ba, or a combination thereof, and X may be Br, I, or a combination thereof. In this way, the light converting nanoparticle according to an embodiment may convert light of less than or equal to near ultraviolet ("UV") wavelengths into visible light as described above by selecting an element having a large atom size.

Attempts to apply inorganic semiconductor particles, such as CdSe and the like, to an X-ray scintillator have been made to reduce a manufacturing cost and simplify a manufacturing process. However, since these inorganic semiconductor particles have bandgap energy of about 1.5 eV to about 2.0 eV, which is much smaller than the bandgap energy of light converting nanoparticles according to an embodiment, an absorption wavelength region and a light emitting wavelength region thereof are close together and may partially overlap. Accordingly, because the absorption wavelength region and the light emitting wavelength region may be close together and may partially overlap, a portion of a light emitting wavelength may be self-absorbed, and thus light converting characteristics may be deteriorated.

On the contrary, since the light converting nanoparticles according to an embodiment have a much larger bandgap energy than that of inorganic semiconductor particles such as CdSe, an absorption wavelength region and an emission wavelength region of the disclosed light converting nanoparticles are only partially overlapped or are completely non-overlapping. That is, the absorption wavelength region and the emission wavelength region of the light converting nanoparticles according to an embodiment are in distinct regions and are separate. Accordingly, the light converting nanoparticles may have improved photoconversion characteristics.

FIG. 1 is a transmission electron microscopy (TEM) image showing an embodiment of a light converting nanoparticle.

The light converting nanoparticle is a crystalline material having a selected structure, e.g., shape or crystal habit. Specifically, the light converting nanoparticle may have a two dimensional hexagonal shape as shown in FIG. 1, when examined through transmission electron microscopy (TEM).

When the light converting nanoparticle according to an embodiment has a two dimensional hexagonal shape, the light converting nanoparticle has a predetermined three dimensional structure. Examples of the three dimensional structure of the light converting nanoparticle satisfying this condition may be a cubic structure, an orthorhombic structure, a rhombic dodecahedron structure, and the like. A combination comprising at least one of the three dimensional structures may be present. The two dimensional shape or the three dimensional structure may change depending on a type of element comprising the light converting nanoparticle, the manufacturing conditions for the light converting nanoparticle, and the like.

Figure 2:
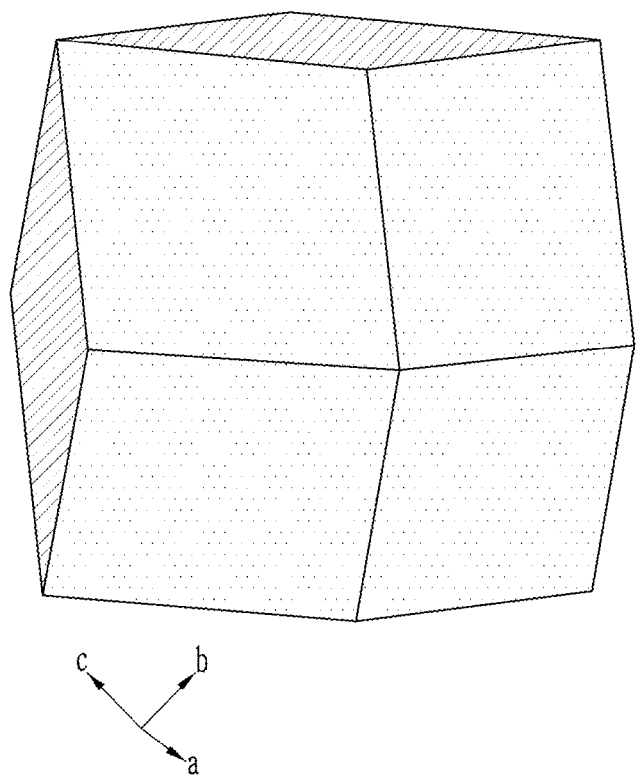
FIG. 2 is a schematic illustration of a three dimensional crystal structure (rhombic dodecahedron) of an embodiment of the light converting nanoparticle.
Figure 3:
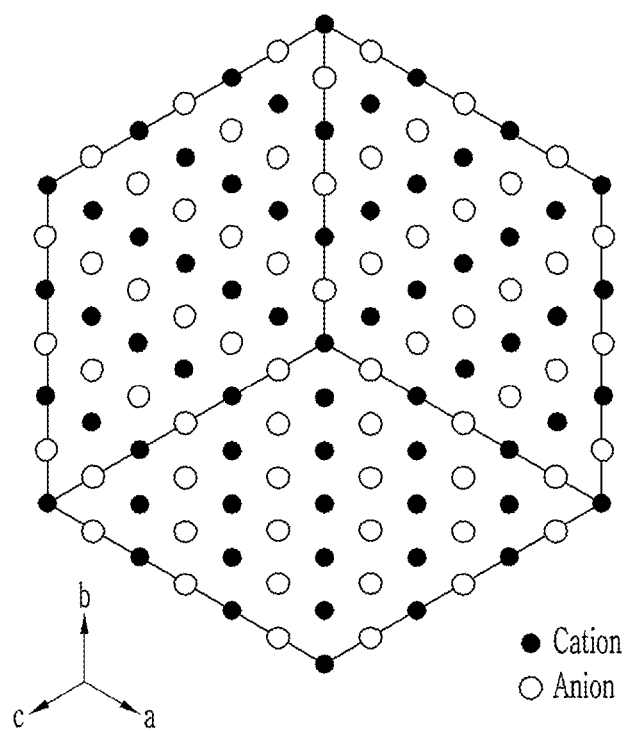
FIG. 3 is a schematic illustration of an embodiment of the light converting nanoparticle when seen from a (111) plane.

FIG. 2 is a schematic illustration of a three dimensional structure (rhombic dodecahedron) of the light converting nanoparticle according to an embodiment, and FIG. 3 is a schematic illustration of the light converting nanoparticle according to an embodiment when seen from a (111) plane.

For example, the light converting nanoparticle may have a rhombic dodecahedron structure as shown in FIG. 2. In other words, the light converting nanoparticle may have twelve planes all consisting of a (110) plane and having a two dimensional hexagonal shape, when seen from the (111) plane, as shown in FIG. 3.

In an embodiment, cations and anions in the light converting nanoparticle may be aligned as a body-centered cubic structure. However, an embodiment is not necessarily limited thereto, and the anions and the cations may be aligned as various structures depending on a type of cation and anion, a manufacturing condition, and the like.

In this way, the light converting nanoparticle according to an embodiment has a predetermined regular three dimensional structure and thus shows excellent transparency for visible light and excellent photoconversion efficiency of an emission wavelength relative to an absorption wavelength compared with an amorphous or weakly crystalline material.

On the other hand, the light converting nanoparticle according to an embodiment has a predetermined particle diameter to reduce or prevent light scattering during emission of visible light due to particle size. As used herein, a particle diameter refers to a maximum distance across a light converting nanoparticle, e.g., a maximum distance across a two dimensional hexagon-shaped light converting nanoparticle, as measured by TEM. For example, the light converting nanoparticle according to an embodiment may have a particle diameter of less than or equal to about 100 nm, less than or equal to about 95 nm, less than or equal to about 90 nm, less than or equal to about 85 nm, less than or equal to about 80 nm, less than or equal to about 75 nm, less than or equal to about 70 nm, less than or equal to about 65 nm, less than or equal to about 60 nm, less than or equal to about 55 nm, or less than or equal to about 50 nm and for example greater than or equal to about 5 nm, greater than or equal to about 10 nm, greater than or equal to about 15 nm, greater than or equal to about 20 nm, or greater than or equal to about 25 nm.

Also, the light converting nanoparticle according to an embodiment may have an average particle diameter of less than or equal to about 75 nm, less than or equal to about 70 nm, less than or equal to about 65 nm, less than or equal to about 60 nm, less than or equal to about 55 nm, less than or equal to about 50 nm, or less than or equal to about 45 nm and, for example, greater than or equal to about 15 nm, greater than or equal to about 20 nm, greater than or equal to about 25 nm, or greater than or equal to about 30 nm. In the present specification, the average particle diameter indicates an arithmetic average of particle diameters of individual light converting nanoparticles when examined with TEM.

While not wanting to be bound by theory, it is understood that light scattering more likely occurs when light collides with a particle having a particle diameter which is greater than 10% (i.e., greater than 1/10) of a wavelength of the light, and the larger the particle diameter is, the greater the possibility that the light scattering will occur. However, the light converting nanoparticle according to an embodiment may have a particle diameter which is similar to, or less than, or equal to about 10% of a wavelength of visible light, for example, a particle diameter which is similar to, or less than, or equal to about 10% of about 380 nm to about 780 nm. Accordingly, the light converting nanoparticle according to an embodiment may minimize light scattering in a visible light wavelength region, which is an emission wavelength region.

Currently-used X-ray scintillators may be formed of bulky materials. Such X-ray scintillator materials have a very large particle diameter, and while thy may have excellent photoconversion efficiency, their manufacture may involve a complex process and at a high cost. Methods of preparing the X-ray scintillator materials as a powder having particles on the order of a micrometer in size has been suggested, but such materials still have a problem with photoconversion efficiency deterioration according to a decrease in particle size and light scattering.

On the contrary, the disclosed light converting nanoparticle has a particle size of tens of nanometers, e.g., less than or equal to about 100 nm, or about 5 nm to about 100 nm, or about 10 nm to about 80 nm, and a selected regular three dimensional structure, and thus may show excellent photoconversion efficiency even though the particle size is decreased into a nano scale. In an embodiment the selected three dimensional structure may comprise a cubic, orthorhombic, or rhombic dodecahedron, e.g., a cubic, orthorhombic, or rhombic dodecahedron crystal habit. A combination comprising at least one of the foregoing may be present.

In addition, the light converting nanoparticle according to an embodiment provides improved transparency for visible light as compared with the bulky material or micrometer scale powder. Accordingly, the light converting nanoparticle provides improved photoconversion efficiency for light having very strong linearity/transparency such as X-ray or γ-ray light, as well as near ultraviolet ("UV") or ultraviolet ("UV") light.

The light converting nanoparticle according to an embodiment may represented by Chemical Formula 1, wherein at least a portion of A is substituted with a dopant. The dopant substituted in the position for A may include, for example, $Tl^+$, $In^+$, $Pb^{2+}$, $Bi^{3+}$, $Ag^+$, $Cu^+$, $Eu^{2+}$, $Mn^{2+}$, or a combination thereof.

The dopant according to an embodiment may improve light converting characteristics of the light converting nanoparticle without significantly changing a basic crystal structure thereof. In other words, the dopant may be substituted for a portion of a cation position of FIG. 3, but does not change the basic three dimensional crystal structure of the light converting nanoparticle.

Figure 4:
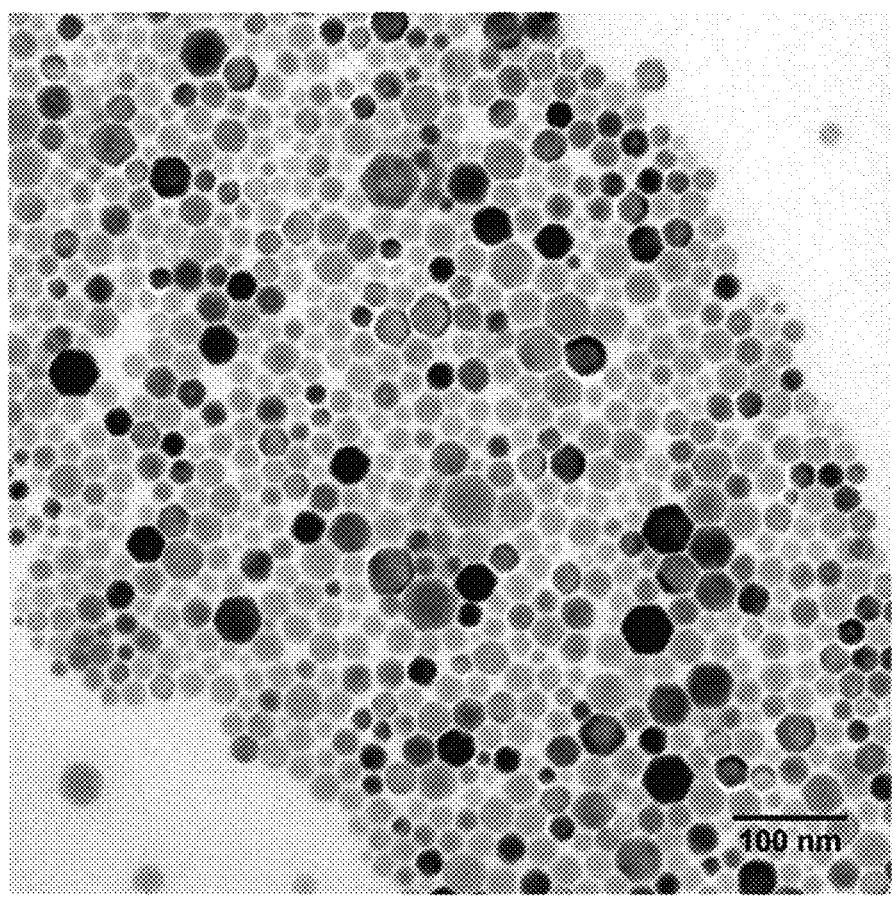
Figure 5:
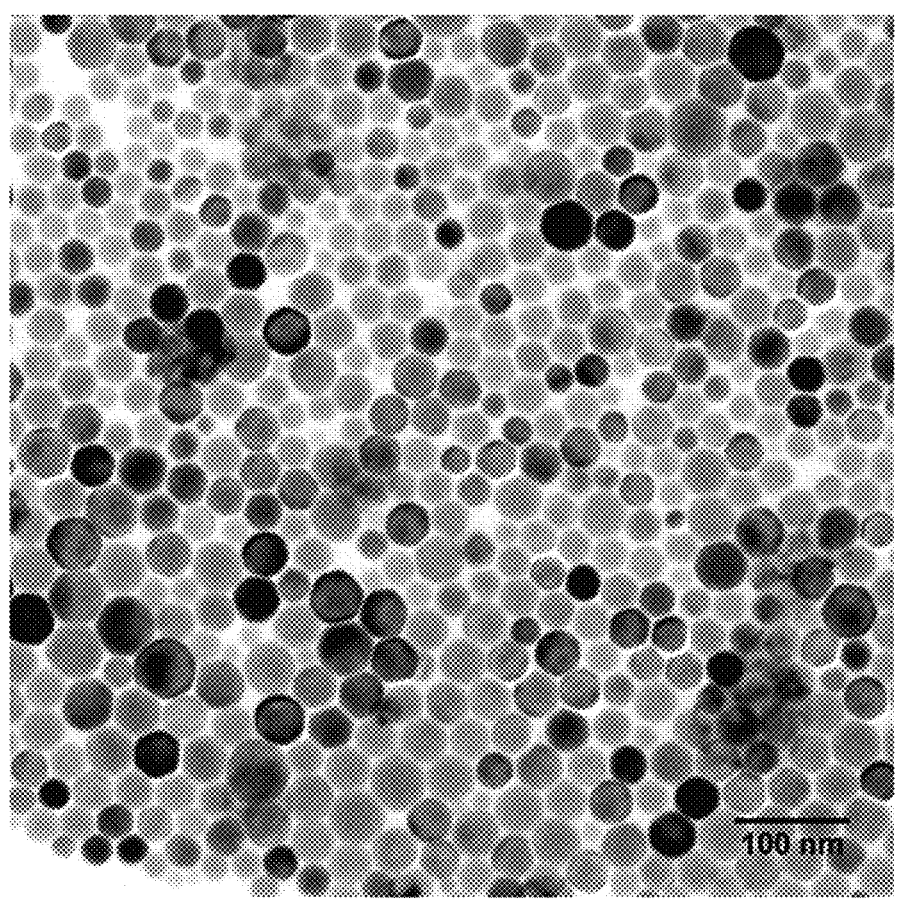

FIGS. 4 and 5 are TEM images of the light converting nanoparticle according to an embodiment. FIG. 4 shows the light converting nanoparticle which is not doped with the dopant (for example, a CsI nanoparticle), and FIG. 5 shows the light converting nanoparticle which is doped with the dopant (for example, a CsI:Tl nanoparticle).

FIGS. 4 and 5 show a difference according to an addition of the dopant under the same manufacturing process condition, in which the CsI:Tl nanoparticle is synthesized by adding 0.5 mol % of Tl relative to Cs.

Referring to FIGS. 4 and 5, the non-doped CsI nanoparticle and the Tl-doped CsI nanoparticle (CsI:Tl) each have a two dimensional hexagon-shaped structure, and the CsI:Tl nanoparticle of FIG. 5 has a minutely larger particle diameter than that of the CsI nanoparticle of FIG. 4.

Figure 6:
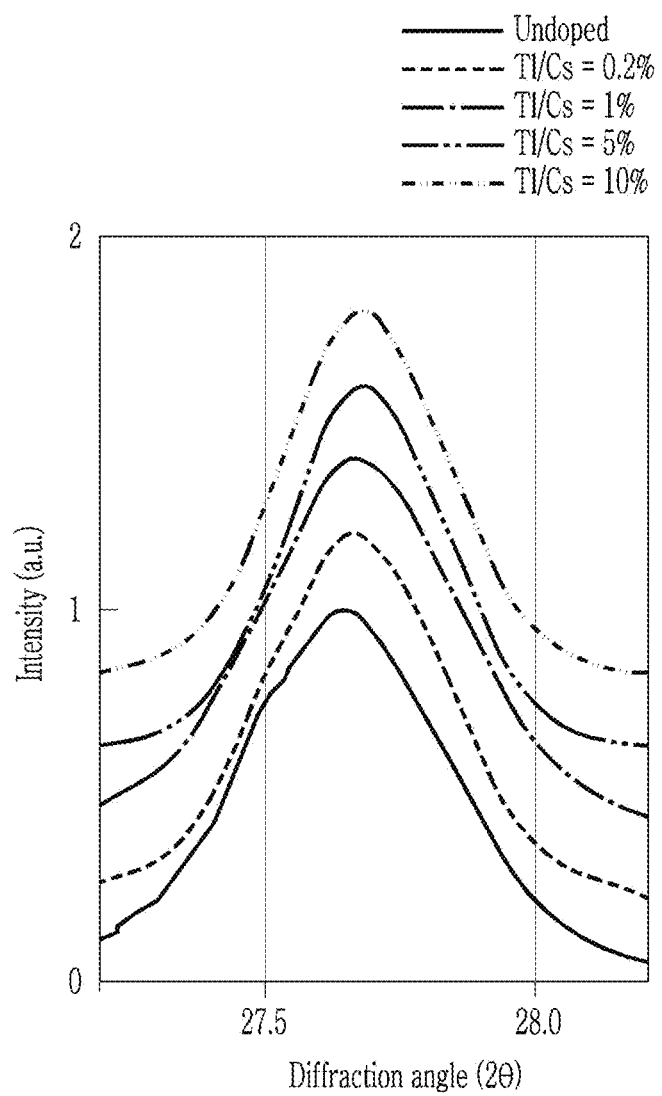
FIG. 6 is a graph of intensity (arbitrary units, a.u.) versus diffraction angle (degrees two theta, 2θ), showing the results of X-ray diffraction ("XRD") analysis of a CsI:Tl light converting nanoparticle ( ) depending on a mole ratio of Tl and Cs (Tl/Cs) used during synthesis of the light converting nanoparticle.

FIG. 6 is a graph showing the results of X-ray diffraction analysis of the light converting nanoparticle doped with the dopant (CsI:Tl) according to an embodiment depending on a mole ratio of Tl relative to Cs (Tl/Cs) used during the synthesis of the light converting nanoparticle.

Referring to FIG. 6, as a doping amount of Tl is increased, the diffraction angle 2θ shifted a little or almost not at all, and accordingly, as a portion of Cs in the crystal structure of FIG. 3 is substituted with Tl, a lattice is minutely contracted, and as the doping amount of Tl is gradually increased, and the lattice is gradually more contracted.

On the other hand, according to an embodiment, the amount of Tl relative to Cs (Tl/Cs) added during the synthesis of the light converting nanoparticle may be for example less than or equal to about 15 mole percent (mol %), less than or equal to about 14 mol %, less than or equal to about 13 mol %, less than or equal to about 12 mol %, less than or equal to about 11 mol %, less than or equal to about 10 mol %, less than or equal to about 9 mol %, less than or equal to about 8 mol %, less than or equal to about 7 mol %, less than or equal to about 6 mol %, or less than or equal to about 5 mol % and for example greater than or equal to about 0.5 mol % or greater than or equal to about 1.0 mol %.

During the synthesis of the light converting nanoparticle, when the addition amount of Tl relative to Cs (Tl/Cs) is less than about 0.5 mol %, a doping effect may be insignificant or insufficient. When the doping amount is greater than about 15 mol %, the dopant may not further improve photoconversion efficiency, and may form a secondary phase separated from the primary phase, with the secondary phase having deteriorated photoconversion efficiency compared with that of the primary phase.

Figure 7:
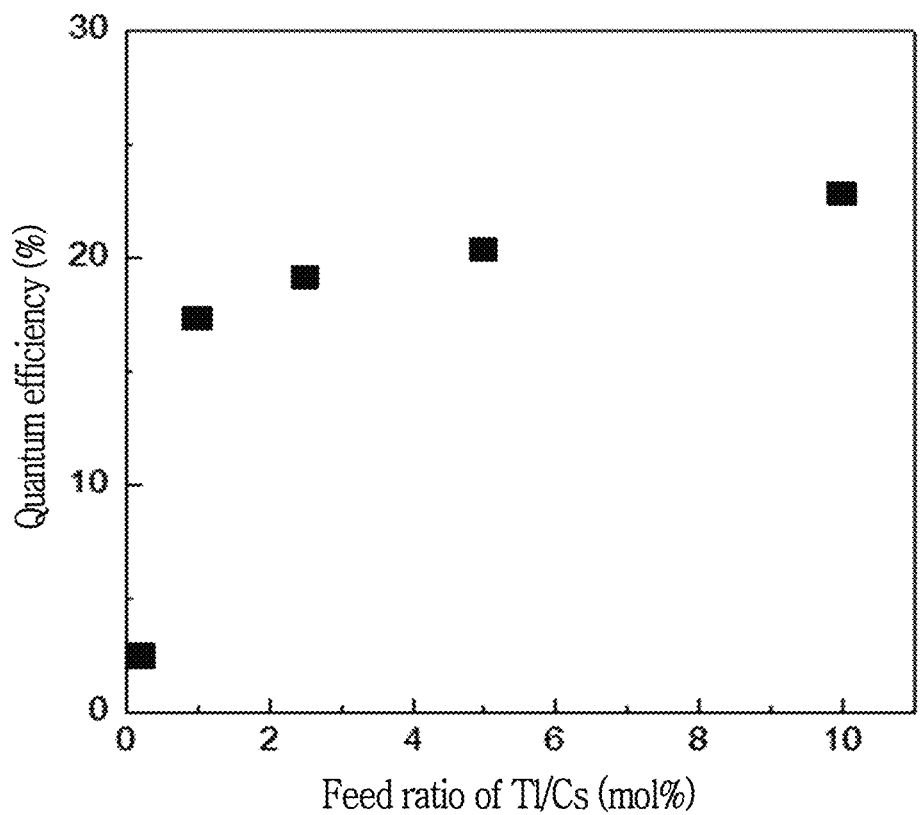
FIG. 7 is a graph of quantum efficiency (QY) (percent, %) versus feed ratio of Tl/Cs (mole percent, mol %), showing quantum efficiency of the CsI:Tl light converting nanoparticle depending on a mole ratio of Tl to Cs (Tl/Cs) used during the synthesis of the light converting nanoparticle.

FIG. 7 is a graph showing the change in quantum efficiency of the light converting nanoparticle (CsI:Tl) according to an embodiment depending on a mole ratio of Tl relative to Cs (Tl/Cs) added during the synthesis of the light converting nanoparticle.

Referring to FIG. 7, when an amount of Tl relative to the amount of Cs is about 0.2 mol %, the light converting nanoparticle shows very low quantum efficiency of less than or equal to about 5%, when Tl is added in an amount of about 1.0 mol % based on the amount of Cs, the quantum efficiency is remarkably increased, when Tl is added in amounts of about 3.0 mol % and about 5.0 mol %, the quantum efficiency reaches about 20%, and when Tl is added in an amount of about 10 mol %, based on the total amount of Cs, the light converting nanoparticle has a quantum efficiency of about 23%.

Figure 8:
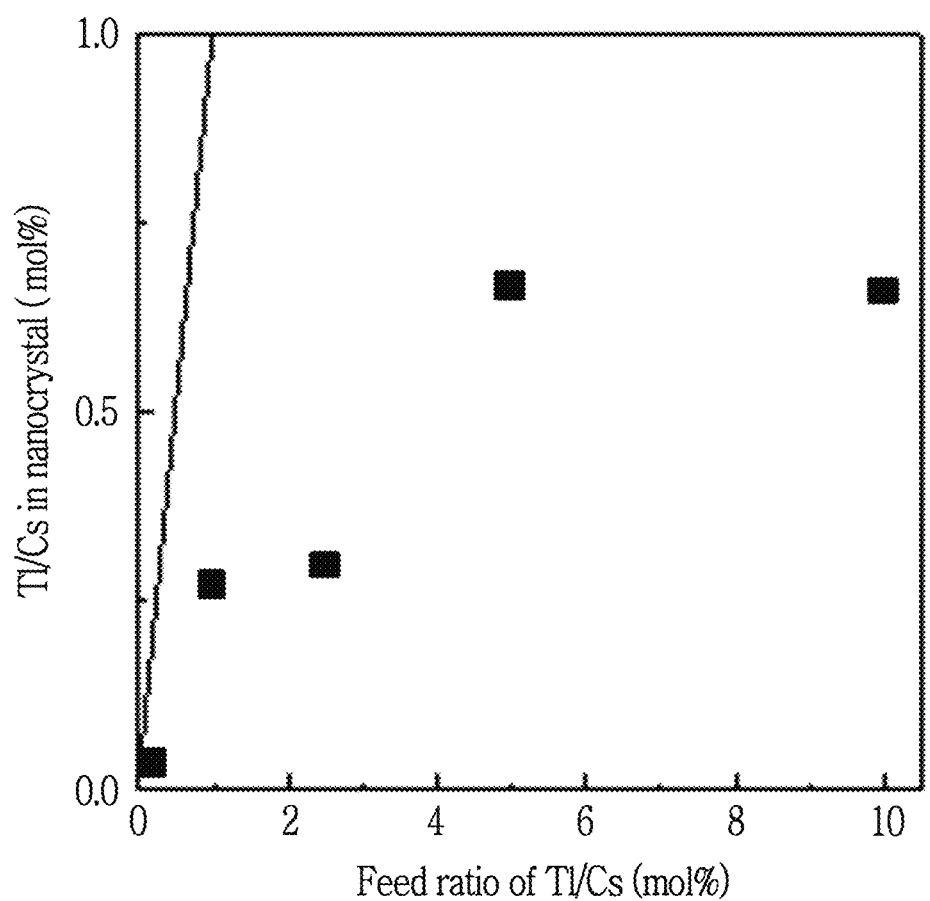
FIG. 8 is a graph of the amount of Tl relative to Cs (Tl/Cs, mol %) in the nanocrystal versus the feed amount of Tl relative to Cs (Tl/Cs, mol %), showing an internal Tl/Cs ratio of the light converting nanoparticle (CsI:Tl) depending on a mole ratio of Tl to Cs (Tl/Cs) used during the synthesis of the light converting nanoparticle.

FIG. 8 is a graph showing an internal Tl/Cs ratio of the light converting nanoparticle (CsI:Tl) according to the addition amount of Tl relative to Cs (Tl/Cs) during the synthesis of the light converting nanoparticle (CsI:Tl) according to an embodiment. FIG. 8 shows an element analysis result of the internal Tl/Cs ratio of the light converting nanoparticle (CsI:Tl) as measured using an inductively coupled plasma.

Referring to FIG. 8, when an amount of Tl relative to Cs is about 0.2 mol %, the light converting nanoparticle may have a Tl/Cs ratio of less than about 0.05%, which is close to 0 mol %, and when an amount of Tl relative to Cs is about 1.0 mol % to about 3.0 mol %, the Tl/Cs ratio sharply increases up to about 0.25 mol % to about 0.3 mol %. In addition, when an amount of Tl relative to Cs is about 5.0 mol % to about 10 mol %, the Tl/Cs ratio sharply increases to about 0.7 mol %.

In this way, the light converting nanoparticle according to an embodiment has an internal Tl/Cs ratio of, for example, less than or equal to about 1 mol %, less than or equal to about 0.9 mol %, less than or equal to about 0.8 mol %, less than or equal to about 0.7 mol %, less than or equal to about 0.6 mol %, less than or equal to about 0.5 mol %, less than or equal to about 0.4 mol %, or less than or equal to about 0.3 mol % and, for example, greater than or equal to about 0.05 mol %, or greater than or equal to about 0.1 mol %.

When a mole ratio Tl substituted in a position of Cs is less than about 0.05 mol %, a doping effect may be insignificant or insufficient, but when in an amount of greater than about 1 mol %, Tl is excessively substituted in the position of Cs and may cause a phase shift and thus form the above-described secondary phase.

The light converting nanoparticle according to an embodiment may have at least one ligand on the surface. The ligand may be a ligand known to one of skill in the art, but is not limited thereto. For example, the ligand may include a compound of the formula RCOOH, $RNH_2$, $R_2NH$, $R_3N$, RSH, $R_3PO$, $R_3P$, ROH, RCOOR', $RPO(OH)_2$, $R_2POOH$, (wherein, R and R' are each independently a substituted or unsubstituted C1 to C24 aliphatic hydrocarbon group or a substituted or unsubstituted C6 to C20 aromatic hydrocarbon group), or a combination thereof.

The ligand coordinates to the surface of the light converting nanoparticle and thus may be bonded thereon. The ligand may also enable the light converting nanoparticle to be well dispersed in a solution. Accordingly, the ligand may increase an overall particle size and have an influence on light converting characteristics. The ligand includes a cation or an anion at a terminal end as an organic surfactant. In other words, the ligand of an embodiment may include a cationic organic surfactant, an anionic organic surfactant, or a combination thereof.

Examples of the ligand compound that is usable for the organic surfactant may include methane thiol, ethane thiol, propane thiol, butane thiol, pentane thiol, hexane thiol, octane thiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine, oleyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, phosphonic acid; phosphine such as methyl phosphine, ethyl phosphine, propyl phosphine, butyl phosphine, pentyl phosphine, and the like; a phosphine compound or an oxide compound thereof such as methyl phosphine oxide, ethyl phosphine oxide, propyl phosphine oxide, butyl phosphine oxide, and the like; diphenyl phosphine, a triphenyl phosphine compound, or an oxide compound thereof, and the like, but is not limited thereto. The ligand may be used alone or as a combination comprising at least one of the foregoing ligands.

On the other hand, the light converting nanoparticle according to an embodiment may have a core-shell structure. In other words, the light converting nanoparticle according to an embodiment may include a core represented by Chemical Formula 1 and at least one shell having the same composition as the core or a different composition than the core.

In this way, when the light converting nanoparticle has the core-shell structure, the light converting nanoparticle may be minimized from oxidization due to direct contact with an external environment or from property deterioration due to a loss of the ligand.

The light converting nanoparticle according to an embodiment may have a shell crystal structure which is the same as or similar to the core crystal structure or may have the same atom alignment as that of the core. For example, when the core is arranged as a body-centered cubic structure, the shell may also have the body-centered cubic structure. Herein, a lattice defect at the core-shell interface may be minimized, and thus photoconversion property deterioration, which may be caused by formation of the shell, may be minimized.

On the other hand, according to an embodiment, the shell may also be an inorganic material belonging to Chemical Formula 1 like the core. Examples of the shell may include $CsBr$, $CsCl$, $CsF$, $BaBr_2$ $BaCl_2$, $BaF_2$, $SrBr_2$ $SrCl_2$ $SrF_2$, or a combination thereof, but is not limited thereto.

The shell according to an embodiment may what is a compound of Chemical Formula 1, and may thus be doped with the aforementioned dopant similar to the core. The dopant doped in the shell may be the same as that of the core or different from that of the core.

The shell according to an embodiment may be formed of a material having a larger bandgap than the bandgap of the core. Herein, luminous efficiency of the light converting nanoparticle may be largely increased due to a strong quantum confinement.

As described above, the light converting nanoparticle according to an embodiment has excellent transparency as an inorganic material nanoparticle having a predetermined particle diameter and a crystal structure, and is capable of absorbing light having a wavelength of less than or equal to near ultraviolet ("UV") light and emitting light having a wavelength in a visible light region.

Hereinafter, a composition for forming a light converting layer and an optical film including the light converting nanoparticle according to an embodiment are illustrated.

According to an embodiment, the light converting nanoparticle, a solvent, a binder, and the like may be combined (e.g., mixed) to prepare a composition for forming the light converting layer.

In an embodiment, a solvent is not particularly limited but may include, for example, water or an organic solvent, such as a C6 to C22 primary alkyl amine, such as hexadecylamine; a C6 to C22 secondary alkyl amine, such as dioctylamine; C6 to C40 tertiary alkyl amine, such as trioctylamine; a nitrogen-containing heterocyclic compound, such as pyridine; a C6 to C40 aliphatic hydrocarbon (e.g., alkane, alkene, or alkyne), such as hexadecane, octadecane, octadecene, or squalane; a C6 to C30 aromatic hydrocarbon, such as phenyldodecane, phenyltetradecane, or phenyl hexadecane; a phosphine substituted with a C6 to C22 alkyl group, such as trioctylphosphine; a phosphine oxide substituted with a C6 to C22 alkyl group, such as trioctylphosphine oxide; a C12 to C22 aromatic ether, such as phenyl ether, or benzyl ether, or a combination thereof.

In an embodiment, a binder is not particularly limited but may include, for example, an organic binder including a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer, or a combination thereof.

The light converting nanoparticle may be uniformly dispersed in the solvent in the composition for forming a light converting layer. The composition for forming a light converting layer, in which the light converting nanoparticle is dispersed, may be coated, dried, and/or cured on a substrate through a wet-process to form a light converting layer and/or an optical film including the light converting nanoparticle, without the need for a complex process such as that used for preparing a bulky material.

Particularly, the composition for forming a light converting layer according to an embodiment has no particular limit in a shape but may have a random shape depending on the shape of the substrate. Accordingly, the composition for forming a light converting layer according to an embodiment may be formed in various shapes such as a curved optical film, an optical film on the surface of which is a plurality of concavo-convex shapes are formed, or the like, in addition to a flat optical film. Also, the composition for forming a light converting layer may be formed as a thin film having a thickness of tens of micrometers to tens of centimeters, or may be formed as a thick film.

Accordingly, the composition for forming a light converting layer and the optical film including the light converting nanoparticle according to an embodiment have excellent process easiness and workability.

Hereinafter, a method of making the light converting nanoparticle according to an embodiment is illustrated.

The method of making the light converting nanoparticle according to an embodiment includes adding (e.g., injecting) a first precursor solution including a halogen element into a reaction vessel, heating the reaction vessel to a predetermined temperature, and adding (e.g., injecting) a second precursor solution including an alkaline metal element, an alkaline-earth metal element, or a combination thereof, into the heated reaction vessel, and reacting the first precursor solution with the second precursor solution to form the light converting nanoparticle.

First, the halogen element is dissolved in an organic solvent to prepare a first precursor solution. Separately, the alkaline metal element, the alkaline-earth metal element, or a combination thereof, is dissolved in the organic solvent to prepare a second precursor solution.

The organic solvent that is useable for forming the first and second precursor solutions is not particularly limited but may include, for example, an organic solvent, such as a C6 to C22 primary alkyl amine, such as hexadecylamine; a C6 to C22 secondary alkyl amine, such as dioctylamine; a C6 to C40 tertiary alkyl amine, such as trioctylamine; a nitrogen-containing heterocyclic compound, such as pyridine; a C6 to C40 aliphatic hydrocarbon (e.g., alkane, alkene, or alkyne), such as hexadecane, octadecane, octadecene, or squalane; a C6 to C30 aromatic hydrocarbon, such as phenyldodecane, phenyltetradecane, or phenyl hexadecane; a phosphine substituted with a C6 to C22 alkyl group, such as trioctylphosphine; a phosphine oxide substituted with a C6 to C22 alkyl group, such as trioctylphosphine oxide; a C12 to C22 aromatic ether, such as phenyl ether, or benzyl ether, or a combination thereof.

A doping material comprising $Tl^+$, $In^+$, $Pb^{2+}$, $Bi^{3+}$, $Ag^+$, $Cu^+$, $Eu^{2+}$, $Mn^{2+}$, or a combination thereof may be prepared. The doping material may be a metal salt or a solution in which the metal salt is dissolved.

Subsequently, the first precursor solution is put in a reaction vessel and heated at a predetermined temperature. According to an embodiment, the reaction vessel may be heated at greater than or equal to about 100° C., greater than or equal to about 150° C., or greater than or equal to about 200° C. and for example less than or equal to about 450° C., less than or equal to about 400° C., less than or equal to about 350° C., less than or equal to about 300° C., or less than or equal to about 250° C. The heating is performed under an atmosphere or an inert atmosphere including a gas such as Ar, Ne, and the like.

Also, before heating the reaction vessel the prepared doping material may be put therein with the first precursor solution and heated together. However, according to an embodiment, the addition of the doping material may be omitted.

Then, the first precursor solution is put in the heated reaction vessel and then, maintained at the heating temperature for predetermined time. According to an embodiment, the temperature may be for example maintained for greater than or equal to about 1 second, greater than or equal to about 2 seconds, greater than or equal to about seconds, greater than or equal to about 4 seconds, greater than or equal to about 5 seconds, greater than or equal to about 10 seconds, greater than or equal to about 1 minute, or greater than or equal to about 2 minutes and for example for less than or equal to about 10 minutes, less than or equal to about 8 minutes, less than or equal to about 6 minutes, or less than or equal to about 5 minutes. During the heating, the first precursor solution and the second precursor solution react with each other and grow a light converting nanoparticle crystal. The light converting nanoparticle crystal may have a size (particle diameter) of less than or equal to about 100 nm by maintaining a temperature within the above-described ranges.

Subsequently, the reaction vessel is sharply cooled down to a temperature within a range of about 0° C. to room temperature, so that the light converting nanoparticle may grow small and uniformly. The cooling may be performed using ice, water or cooled air at a predetermined temperature, or like.

Subsequently, the materials in the reaction vessel are centrifuged, or the like, to separate particles from the solvent, washed at least once, and purified to obtain a light converting nanoparticle satisfying a desired particle diameter and a crystal structure according to an embodiment.

On the other hand, according to an embodiment, the light converting nanoparticle may be further reacted with the ligand precursor to attach the ligand on the surface of the light converting nanoparticle. The ligand precursor may include the ligand and a solvent.

The ligand may use the above-described cationic organic surfactant, anionic organic surfactant, or a combination thereof, for example, the above material alone or a mixture of at least two.

The solvent may be an organic solvent having low reactivity with the ligand, for example, a non-polar solvent. Examples of the nonpolar solvent may include toluene, hexane, cyclohexane, decane, dodecane, tetradecane, hexadecane, octadecane, octadecene, and like.

On the other hand, the light converting nanoparticle having a core-shell structure according to an embodiment may be made by further putting a precursor for forming a shell in the mixture with the first and second precursors and heating them, or by using the first and second precursors to form the light converting nanoparticle and heat-treating the light converting nanoparticle. The precursor for forming a shell is not limited and may include various suitable material in a well-known method and a material having the same or similar atom alignment structure to that of the core as described above. In addition, the precursor for forming a shell may be a material having a large bandgap compared with the first and second precursors as described above.

In this way, the method of making a light converting nanoparticle according to an embodiment may provide the light converting nanoparticle with a low cost and through a simple process compared with a vacuum deposition method or a Czochralski ("Cz") method of making the conventional bulky material.

Hereinafter, the embodiments are illustrated in more detail with reference to examples. However, they are example embodiments of the present invention, and the present invention is not limited thereto.

EXAMPLES

Preparation Example 1

Making of CsI Nanoparticle 0.5 milliliters (mL) (I=0.1 millimoles (mmol)) of oleylammonium iodide is put in 5 mL of an octadecene solvent in a reaction vessel, and then, the reaction vessel is heated at 120° C. for 30 minutes under a vacuum atmosphere to remove moisture therefrom.

Subsequently, the reaction vessel is heated at 200° C. to 250° C. under an Ar atmosphere, and cesium-oleate (Cs- Oleate) is put therein. Herein, an amount of the cesium-oleate is adjusted in a mole ratio of 1:2 between the cesium-oleate and the oleylammonium iodide in the reaction vessel. (Cs=0.05 mmol)

Then, the reaction vessel is maintained at the heating temperature of 150° C. to 250° C. for 5 seconds to 5 minutes and then, put in an ice bath and rapidly cooled down.

Subsequently, the material is taken from the reaction vessel and then put in a centrifuge and centrifuged at 12,000 rotations per minute (rpm), and the separated solid CsI nanoparticles are redispersed in toluene or hexane.

Preparation Example 2

Making of CsI Nanoparticle

Solid CsI:Tl nanoparticles are separated through the same process as Preparation Example 1 except for putting 0.0001 mmol to 0.005 mmol of thallium iodide (TlI) along with the oleyl ammonium in a reaction vessel before heating the reaction vessel and then, redispersing the separated solid CsI:Tl nanoparticles in toluene or hexane.

Average Particle Diameter and Quantum Efficiency Change Depending on Reaction Temperature CsI:Tl nanoparticles are made by fixing the addition amount of thallium iodide (TlI) as 0.0025 mmol and the heating maintenance time as 1 minute under the same conditions of Preparation Example 2, but respectively changing the heating temperature (reaction temperature) of the reaction vessel into 150° C. (Example 1), 175° C. (Example 2), 200° C. (Example 3), and 250° C. (Example 4). The average particle diameter and quantum efficiency changes of the CsI:Tl nanoparticles are shown in Table 1.

In Table 1, the "average particle diameter" is obtained by calculating the arithmetic mean particle diameter of individual nanoparticles and the standard deviation using TEM, and the "quantum efficiency" is obtained by measuring and calculating a ratio of light emission of a specimen in a wavelength range of 350 nm to 650 nm to light absorption of the specimen at about 300 nm when light of 300 nm is radiated using a spectrophotometer equipped with an integrating sphere.

TABLE 1

|  | Particle Diameter (±standard deviation) | Quantum Efficiency |
|---|---|---|
| Example 1 | 25.8 nm (±7.9 nm) | 11.2% |
| Example 2 | 27.8 nm (±6.5 nm) | 12.8% |
| Example 3 | 31.3 nm (±6.5 nm) | 20.3% |
| Example 4 | 54.2 nm (±16.0 nm) | 26.1% |

Referring to Table 1, as the reaction temperature is increased, the average particle diameter and quantum efficiency of CsI:Tl nanoparticles are gradually increased. The nanoparticles of Examples 2 and 3 do not have a large difference in average particle diameter, but quantum efficiency of Example 3 is much improved.

Average Particle Diameter and Quantum Efficiency Changes Depending on Reaction Time CsI:Tl nanoparticles are made by fixing the addition amount of thallium iodide (TlI) as 0.0025 mmol and the heating temperature at 200° C. in the same conditions of Preparation Example 2, but respectively changing the heating maintenance time (reaction time) into 5 seconds (Example 5), 1 minute (Example 3), and 5 minutes (Example 6), and then, average particle diameter and quantum efficiency changes of the CsI:Tl nanoparticles are measured and results shown in Table 2. The "average particle diameter" and the "quantum efficiency" of Table 2 are calculated through the same process as Table 1.

TABLE 2

|  | Average particle diameter (±standard deviation) | Quantum efficiency |
|---|---|---|
| Example 5 | 21.0 nm (±6.0 nm) | 13.6% |
| Example 3 | 31.3 nm (±6.5 nm) | 20.3% |
| Example 6 | 61.9 nm (±13.7 nm) | 29.3% |

Referring to Table 2, as the reaction time is increased, both of the average particle diameter and the quantum efficiency are all increased. Particularly, Example 6 where the reaction time is set as 5 minutes shows excellent quantum efficiency of 29.3%, and Example 3 wherein the reaction time is set as 1 minute shows about 20.3% quantum efficiency as well as having a small average particle diameter.

Average Particle Diameter and Quantum Efficiency Changes Depending on Amount of Dopant CsI:Tl nanoparticles are made by fixing the heating temperature of the reaction vessel at 200° C. and the heating time as 1 minute in the same conditions of Preparation Example 2, but respectively changing the addition amount of thallium iodide (TlI) (the amount of a dopant) into 0.0001 mmol (Example 7), 0.0005 mmol (Example 8), 0.00125 mmol (Example 9), 0.0025 mmol (Example 3), and 0.005 mmol (Example 10), and average particle diameter and quantum efficiency changes of the CsI:Tl nanoparticles are shown in Table 3. The "average particle diameter" and the "quantum efficiency" in Table 3 are all calculated through the same process as described for Table 1.

TABLE 3

|  | Average particle diameter (±deviation) | Quantum efficiency |
|---|---|---|
| Example 7 | 32.3 nm (±10.6 nm) | 2.4% |
| Example 8 | 27.1 nm (±7.3 nm) | 17.3% |
| Example 9 | 33.6 nm (±9.3 nm) | 19.1% |
| Example 3 | 31.3 nm (±6.5 nm) | 20.3% |
| Example 10 | 68.2 nm (±21.6 nm) | 22.8% |

Referring to Table 3, as the amount of the dopant is increased, quantum efficiency is gradually increased, but an average particle diameter shows no constant aspect. Without wishing to be bound by any theory, it is believed that the nanoparticles show a little non-uniform initial nuclear formation according to the addition of the dopant, and in addition, no large average particle diameter difference in a particular section due to low solubility of Tl, even though the amount of the dopant is increased. On the other hand, Example 10 to which 0.005 mmol of the dopant is added shows insignificant quantum efficiency relative to the increase in average particle diameter compared with other example embodiments Without wishing to be bound by any theory, it is believed that when the dopant is relatively more substituted in a position of Cs, a secondary phase deteriorating the quantum efficiency is formed.

Light Absorption Characteristics Analysis Depending on a Type of Dopant

CsI nanoparticles of Example 11 are made by fixing the heating temperature of the reaction vessel at 200° C. and maintaining the heating time as 1 minute in the condition of Preparation Example 1.

In addition, the CsI nanoparticles are made by fixing the heating temperature of the reaction vessel at 200° C. and the heating time as 1 minute in the condition of Preparation Example 2 and putting 0.0025 mmol of a dopant, but respectively changing the type of the dopant used as follows: thallium iodide (Example 3), copper iodide (Example 11), silver iodide (Example 12), indium iodide (Example 13), and lead iodide (Example 14). The light absorption characteristics are shown in FIG. 9.

Figure 9:
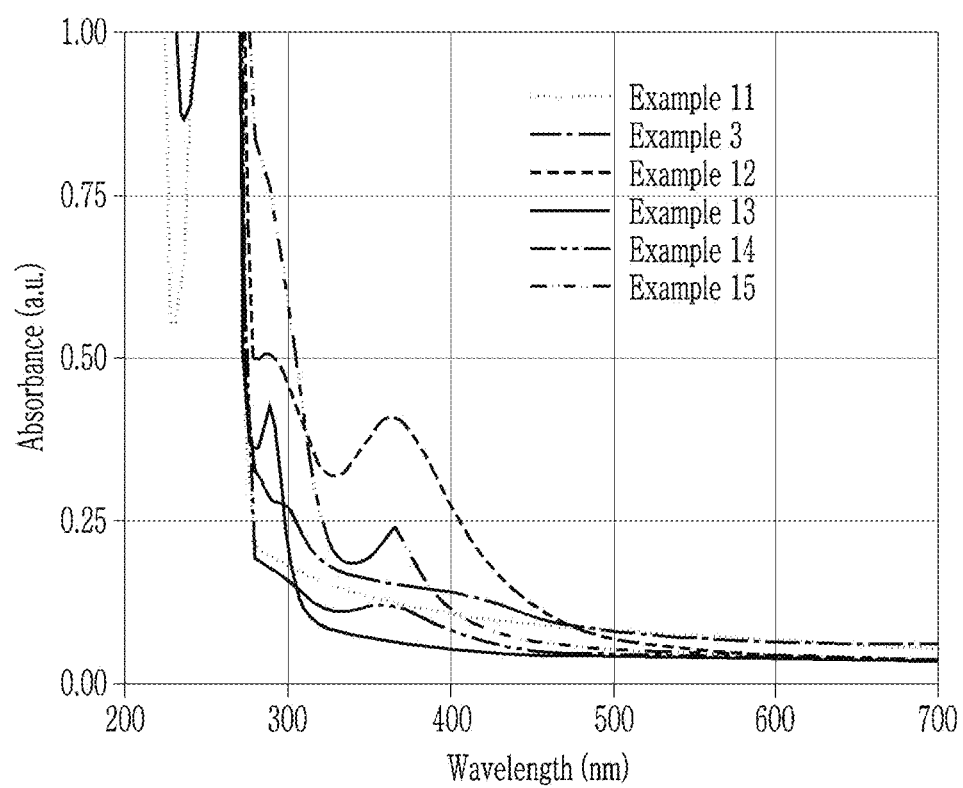
FIG. 9 is a graph of absorbance (a.u.) versus wavelength (nm), showing light absorption characteristics of the light converting nanoparticle depending on the type of dopant in accordance with Examples 3 and 11-15.

FIG. 9 is a graph showing light absorption characteristics of the light converting nanoparticle depending on the type of a dopant.

Referring to FIG. 9, absorption capability of Examples 3 and 11 to 15 is increased at a wavelength of less than about 380 nm and remarkably increased primarily at a wavelength of about less than or equal to about 300 nm. Accordingly, light converting nanoparticles having absorption capability at a wavelength of less than or equal to near infrared light may be made despite diversification of the dopant into $Tl^+$, $In^+$, $Pb^{2+}$, $Bi^{3+}$ $Ag^+$, $Cu^+$, $Eu^{2+}$, and $Mn^{2+}$.

Quantum Efficiency Change Depending on Amount of Ligand

Figure 10:
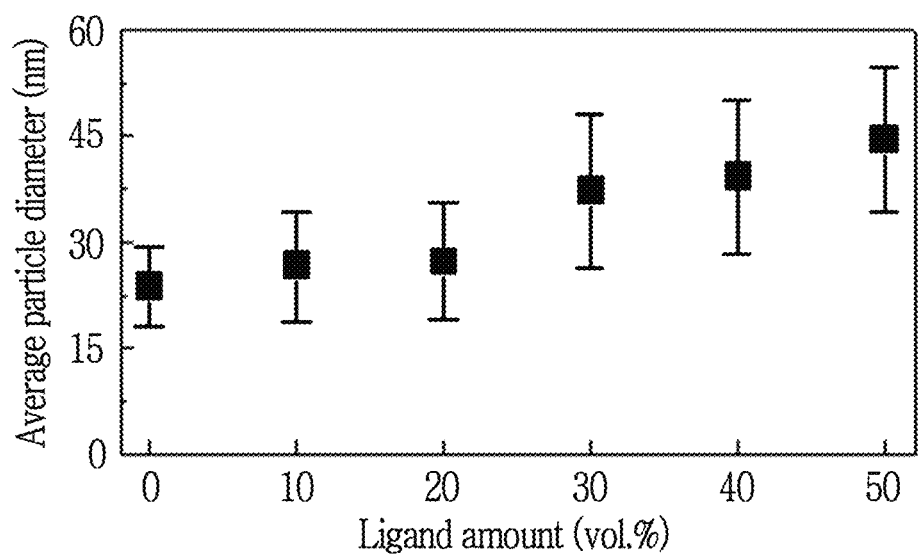
FIG. 10 is a graph of average particle diameter (nm) versus ligand amount (volume percent, vol %), showing an average particle diameter of the nanoparticle depending on a volume amount of a ligand based on the entire volume of a ligand precursor.
Figure 11:
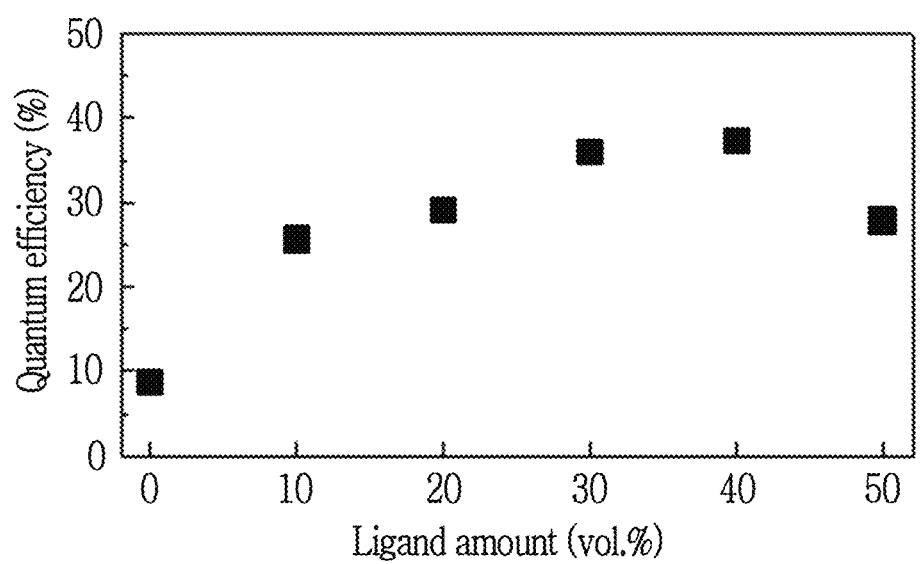
FIG. 11 is a graph of quantum efficiency (%) versus ligand amount (vol %), showing a quantum efficiency change depending on a volume percentage of the ligand based on the total volume of the ligand precursor.
Figure 12:
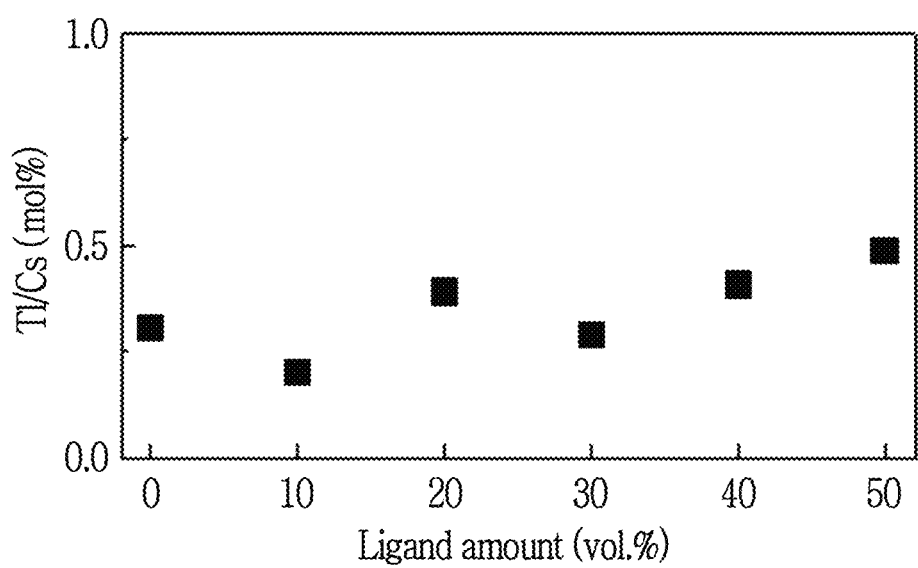
FIG. 12 is a graph of the molar ratio of Tl to Cs (Tl/Cs) versus ligand amount (vol %), showing a change in molar ratio of Tl to Cs depending on a volume percentage of the ligand based on the total volume of the ligand precursor.

When a ligand precursor, a solvent octadecene) including oleic acid and oleyl amine in a mole ratio of 1:1 is attached on the surface of the nanoparticles according to Example 3, and herein, when an amount of a ligand based on the entire volume of the ligand precursor is 10 volume % (Example 15), 20 volume % (Example 16), 30 volume % (Example 17), 40 volume % (Example 18), and 50 volume % (Example 19), quantum efficiency, Tl/Cs, and an average particle diameter thereof are respectively shown in FIGS. 10 to 12.

FIG. 10 is a graph showing an average particle diameter of nanoparticles depending on a volume change of the ligand based on the total volume of the ligand precursor, FIG. 11 is a graph showing a quantum efficiency change depending on a volume change of the ligand based on the total volume of the ligand precursor, and FIG. 12 is a graph showing a Tl/Cs mole ratio change in the nanoparticles depending on a volume change of the ligand based on the total volume of the ligand precursor.

Referring to FIG. 10, as an amount of the ligand in the ligand precursor is increased, an average particle diameter of the nanoparticles is gradually increased. Without wishing to be bound by any theory, it is believed that as the amount of the ligand is increased, the ligand is more coordinated on the surface of the nanoparticles and thus increases the average particle diameter.

Referring to FIG. 11, as the amount of the ligand is increased in the ligand precursor, the quantum efficiency may also be gradually increased, which shows a similar trend to that of the average particle diameter increase of the nanoparticles of FIG. 10.

On the other hand, in FIG. 11, Example 19 including 50 volume % of the ligand shows a little quantum efficiency decrease compared with Examples 17 and 18. Without wishing to be bound by any theory, it is believed that when the amount of the ligand in the ligand precursor is close to 50 volume %, viscosity of the ligand precursor is increased, and the ligand may be difficult to mix with an organic solvent and thus to coordinate on the surface of the nanoparticles. In addition, the ligand becomes too many in the ligand precursor and thus bonded one another. Accordingly, an amount of the ligand may desirably be appropriately adjusted with consideration to compatibility with a solvent, viscosity, agitability, a type of ligand, and the like.

On the other hand, referring to FIG. 12, a Tl/Cs ratio of the nanoparticle changes a little as the amount of the ligand is increased, but shows no notable change. Accordingly, referring to FIGS. 10 to 12, as the amount of the ligand is increased in the ligand precursor, an average particle diameter of the nanoparticles is increased, and accordingly, external quantum efficiency is also increased.

Emission Wavelength Change Depending on Absorption Wavelength

Figure 13:
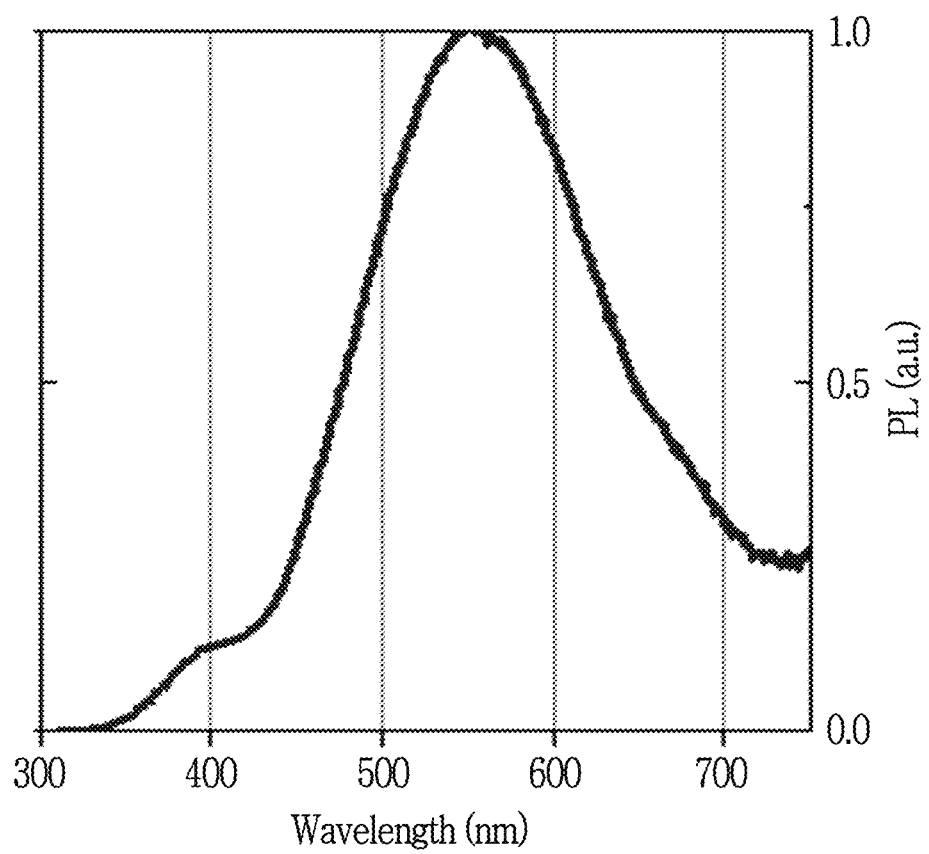
FIG. 13 is a graph of photoluminescence (PL, a.u.) versus wavelength (nm), showing light emitting characteristics of a CsI:Tl nanoparticle according to Example 9.

A wavelength of light emitted after radiating 300 nm of ultraviolet (UV) light into the CsI:Tl nanoparticles of Example 9 is measured and shown in FIG. 13.

Figure 14:
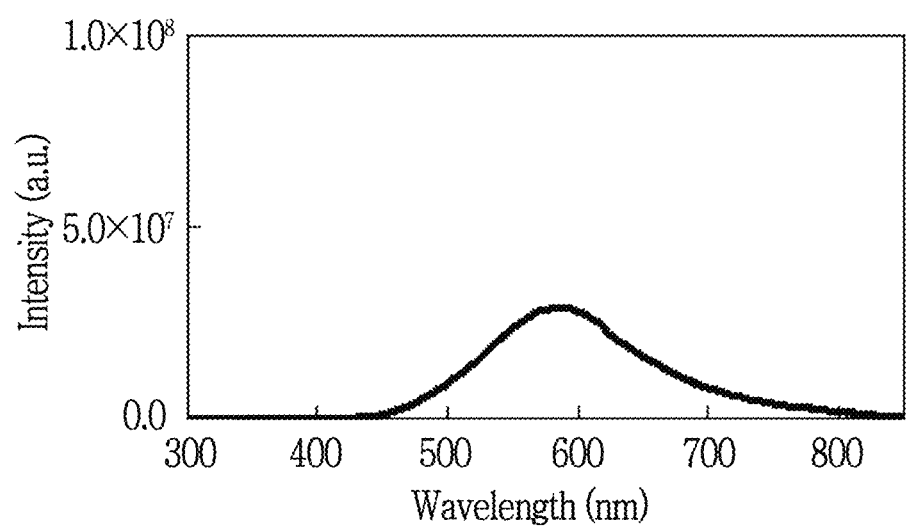
FIG. 14 is a graph of intensity (a.u.) versus wavelength (nm) showing X-ray photo conversion characteristics of the CsI:Tl nanoparticle according to Example 9.

A wavelength of light emitted after radiating an X-ray of 50 kiloelectronvolts (keV) (a Cu cathode, 50 kilovolts (kV), 60 milliamperes (mA)) into the CsI:Tl nanoparticles of Example 9 is measured and shown in FIG. 14.

FIG. 13 is a graph showing light emitting characteristics of the CsI:Tl nanoparticles according to Example 9, and FIG. 14 is a wavelength-intensity graph showing X-ray light converting characteristics of the CsI:Tl nanoparticles according to Example 9.

Referring to FIGS. 13 and 14, the CsI:Tl nanoparticles according to Example 9 emits visible light having a central absorption wavelength in a range of about 500 nm to 600 nm, and when the CsI:Tl nanoparticles absorbs more X-rays than ultraviolet ("UV") light, the central absorption wavelength of the emitted visible light is a further shifted a little towards the right.

On the other hand, referring to FIG. 14, the CsI:Tl nanoparticles according to Example 9 show intensity of about 30% compared with a prior art bulky material (e.g., CsI:Tl bulk particles having a particle diameter of 500 micrometers to 1,000 micrometers). However, the intensity is decreased as a size of the nanoparticles is decreased, and as aforementioned, light converting nanoparticle simultaneously having excellent transparency and light converting characteristics compared with the bulky material may be obtained by adjusting a reaction temperature, reaction time, a type and an amount of dopant, a type of ligand, the formation (or not) of a shell, a formation condition for the shell, and the like. For example, when a nanocrystal has a core-shell structure including a shell including a material having a larger bandgap than that of a core, the shell may not only minimize exposure of the core, but a quantum confinement effect may also be surely obtained, and accordingly, excellent X-ray light emitting characteristics may be obtained compared with the conventional bulky material.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A light converting nanoparticle comprising:
a compound represented by Chemical Formula 1, $$AX_x \quad \text{Chemical Formula 1}$$

wherein, in Chemical Formula 1,
A comprises an alkaline metal element or an alkaline-earth metal element,
X comprises a halogen element, and
x is 1 or 2 and is selected such that Chemical Formula 1 is electrically neutral, and a dopant substituted for a portion of A, wherein the dopant comprises $Tl^+$, $In^+$, $Pb^{2+}$, $Ag^+$, $Cu^+$, $Eu^{2+}$, $Mn^{2+}$, or a combination thereof, wherein a content of the dopant is less than 15 mole percent, based on a total moles of A, wherein the light converting nanoparticle has a particle diameter of less than or equal to about 100 nanometers, and wherein the light converting nanoparticle has a cubic structure, an orthorhombic structure, a rhombic dodecahedron structure, or a combination thereof.

2. The light converting nanoparticle of claim 1, wherein a bandgap energy of the light converting nanoparticle is greater than or equal to about 3.5 electron volts.

3. The light converting nanoparticle of claim 1, wherein A and X each independently comprise a Period 3 element to a Period 6 element of the Periodic Table of the Elements, and wherein a maximum difference between a value of the period of A and a value of the period of X is 1.

4. The light converting nanoparticle of claim 1, wherein A comprises Rb, Cs, Sr, Ba, or a combination thereof, and X comprises Br, I, or a combination thereof.

5. The light converting nanoparticle of claim 1, wherein the light converting nanoparticle has a particle diameter of about 20 nanometers to about 50 nanometers.

6. The light converting nanoparticle of claim 1, wherein an amount of the dopant is about 0.05 mole percent to about 1 mole percent, based on a total moles of A.

7. The light converting nanoparticle of claim 1, further comprising a ligand, which is attached to a surface of the light converting nanoparticle.

8. The light converting nanoparticle of claim 7, wherein the ligand comprises a cationic organic surfactant, an anionic organic surfactant, or a combination thereof.

9. The light converting nanoparticle of claim 8, wherein the ligand comprises oleic acid, octanoic acid, phosphonic acid, oleyl amine, octyl amine, or a combination thereof.

10. The light converting nanoparticle of claim 1, wherein an absorption wavelength of the light converting nanoparticle is less than or equal to about 300 nanometers, and wherein an emission wavelength of the light converting nanoparticle is about 380 nanometers to about 780 nanometers.

11. The light converting nanoparticle of claim 9, wherein a central emission wavelength of the light converting nanoparticle is about 500 nanometers to about 600 nanometers.

12. A composition for forming a light converting layer, the composition comprising the light converting nanoparticle of claim 1.

13. An optical film comprising the light converting nanoparticle of claim 1.

14. A method of making a light converting nanoparticle, the method comprising:

adding a first precursor solution comprising a halogen element into a reaction vessel;

adding a dopant comprising $Tl^+$, $In^+$, $Pb^{2+}$, $Ag^+$, $Cu^+$, $Eu^{2+}$, $Mn^{2+}$, or a combination thereof to the reaction vessel;

heating the reaction vessel to a selected temperature; and contacting the first precursor solution with a second precursor solution, the second precursor solution comprising an alkaline metal element, an alkaline-earth metal element, or a combination thereof to form the light converting nanoparticle, wherein the light converting nanoparticle comprises a compound represented by Chemical Formula 1, $$AX_x \qquad \text{Chemical Formula 1}$$

wherein, in Chemical Formula 1,

A comprises an alkaline metal element or an alkaline-earth metal element,

X comprises a halogen element, x is 1 or 2 and is selected such that Chemical Formula 1 is electrically neutral, and a dopant substituted for a portion of A, wherein the dopant comprises $Tl^+$, $In^+$, $Pb^{2+}$, $Ag^+$, $Cu^+$, $Eu^{2+}$, $Mn^{2+}$, or a combination thereof, wherein a content of the dopant is less than 15 mole percent, based on a total moles of A, wherein the light converting nanoparticle has a particle diameter of less than or equal to about 100 nanometers, and wherein the light converting nanoparticle comprises an orthorhombic structure, a cubic structure, a rhombic dodecahedron structure, or a combination thereof.

15. The method of claim 14, which further comprises reacting the light converting nanoparticle with a ligand precursor to attach the ligand to a surface of the light converting nanoparticle.

16. The method of claim 14, wherein the predetermined temperature is about 100° C. to about 400° C.

17. The method of claim 14, further comprising maintaining a temperature of the reaction vessel for about 1 second to about 10 minutes after adding the first precursor solution into the reaction vessel.

18. The method of claim 14, wherein an absorption wavelength of the light converting nanoparticle is less than or equal to about 300 nanometers and an emission wavelength of the light converting nanoparticle is about 380 nanometers to about 780 nanometers.

* * * * *